(12) United States Patent
Pei et al.

(10) Patent No.: US 7,441,926 B2
(45) Date of Patent: Oct. 28, 2008

(54) LIGHT EMITTING DIODE PACKAGE

(75) Inventors: Chien-Chang Pei, Linkou Township, Taipei County (TW); Shih-Jen Chuang, Taoyuan Hsien (TW)

(73) Assignee: Everlight Electronics Co., Ltd., Tu Chen (TW)

( * ) Notice: Subject to any disclaimer, the term of this patent is extended or adjusted under 35 U.S.C. 154(b) by 0 days.

(21) Appl. No.: 11/635,046

(22) Filed: Dec. 7, 2006

(65) Prior Publication Data

US 2008/0013319 A1    Jan. 17, 2008

(30) Foreign Application Priority Data

Jul. 13, 2006    (TW) .............................. 95212321 U

(51) Int. Cl.
*F21V 29/00*    (2006.01)

(52) U.S. Cl. ....................... 362/294; 362/373; 362/800; 257/98

(58) Field of Classification Search ................. 362/294, 362/373, 800; 257/98–100
See application file for complete search history.

(56) References Cited

U.S. PATENT DOCUMENTS

| | | | | |
|---|---|---|---|---|
| 6,045,240 A | * | 4/2000 | Hochstein | .................... 362/294 |
| 6,641,284 B2 | * | 11/2003 | Stopa et al. | .................. 362/240 |
| 7,244,965 B2 | * | 7/2007 | Andrews et al. | ............... 257/98 |
| 2006/0180821 A1 | * | 8/2006 | Fan et al. | ....................... 257/98 |

* cited by examiner

*Primary Examiner*—John A Ward
(74) *Attorney, Agent, or Firm*—Rabin & Berdo, PC

(57) ABSTRACT

A light emitting diode package is disclosed. It includes a chip, a slug, a PCB, a lens and a reflector. The chip is mounted on the slug. The slug transmits the heat of the chip out of the light emitting diode package. The PCB connects the chip with circuits or wires. The lens transmits the emitting light of the chip out of the light emitting diode package. The reflector reflects the emitting light of the chip, and combines the slug, the PCB and the lens together.

20 Claims, 9 Drawing Sheets

LIGHT EMITTING DIODE PACKAGE

RELATED APPLICATIONS

The present application is based on, and claims priority from, Taiwan Application Serial Number 95212321, filed Jul. 13, 2006, the disclosure of which is hereby incorporated by reference herein in its entirety.

BACKGROUND

1. Field of Invention

The present invention relates to a light emitting diode package. More particularly, the present invention relates to a light emitting diode package with several kinds of pads, and all elementary parts fixed by the reflector.

2. Description of Related Art

An LED is a lighting device that has quickly developed in recent years. Compared with traditional light sources, the advantages are smaller volume, short response time, long life, low driving voltage and better anti-shock capability. According to chip type and manufacturing process control, various kinds of monochromatic LED lighting devices could be produced.

A certain monochromatic LED matches a specific composition of phosphor powder, which could produce white light visible to humans using the optics principle of complementary colors. The best combination of light emitting efficiency includes a blue LED and a specific composition of phosphor powder at present. In addition, arranging the red LED, the green LED and the blue LED in a package closely, which could produce a white light visible to humans vision using the optics principle of complementary colors, too.

With Lumen per Watt (lm/W) provided by an LED device improving progressively, the high power white LED device has already approached the performance of the traditional incandescent lamp. However, various application problems of traditional package structures have arisen.

For example, conventional LED devices are electrically connected to a PCB (Printed Circuit Board) via dual-in-line-package (DIP) pins, but this approach can form voids when poor quality solder paste is used or man-made soldering errors miss some pins. Furthermore, the thickness of the whole package structure cannot be thinned out further.

Therefore being able to offer a kind of LED device that can be combined closely with circuit board is very important. The LED device can be applied when the least number of LED devices are required to output various kinds of color. The embodiment of the present invention has various kinds of solderable circuits for user to vary outputting light color or luminous intensity in accordance with demand. Moreover, it can reduce the quantity of LED devices per unit area.

SUMMARY

A light emitting diode package includes a printed circuit board, a heat sink, a lens and a reflector.

The printed circuit board includes an indentation, a plurality of through holes and a plurality of solderable circuits. The heat sink includes a chip-mounting set, a plurality of horn-like through holes, a plurality of protrusions and a hooking part. The heat sink putting in the indentation, and the plurality of protrusions and the PCB forming an embedded structure. The lens placed on the printed circuit board. The reflector passes through the plurality of through holes and the plurality of horn-like through holes, and surrounding a surrounding edge of the lens.

The plurality of solderable circuits extends from the top-side of the printed circuit board to the side of the printed circuit board, and then connects to the bottom-side of the printed circuit board.

The reflector includes a circular part, a plurality pillars and a rectangular part. The circular part surrounded a surrounding edge of the lens. The plurality pillars put in the plurality of through holes. The rectangular part includes a plurality of horn-like pillars. The plurality of horn-like pillars put in the plurality of horn-like through holes, and the rectangular part placed in the indentation. The rectangular part and the hooking part form an embedded structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
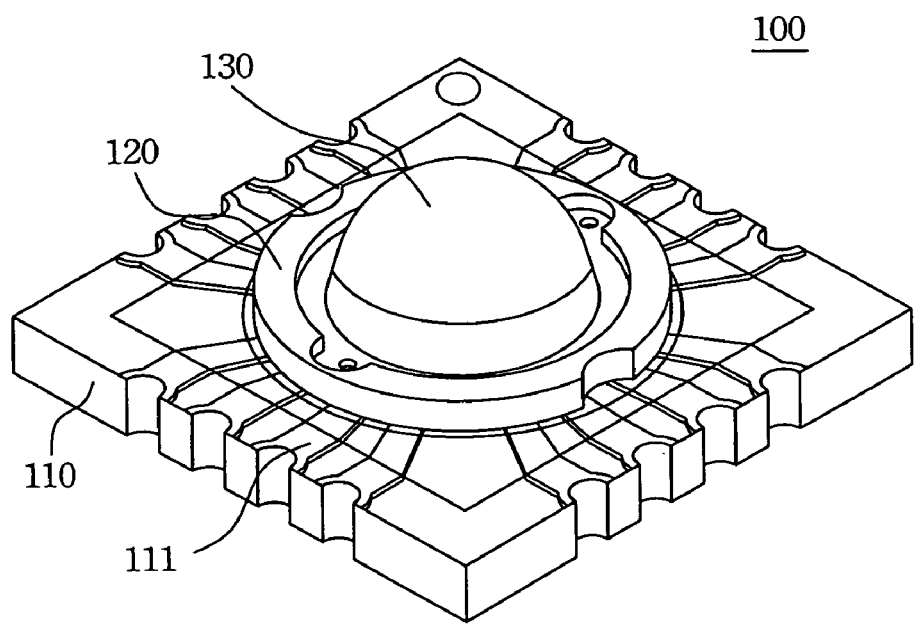
FIG. 1 illustrates a perspective view of an LED device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

While the specification concludes with claims defining the features of the invention that are regarded as novel, it is believed that the invention will be better understood from a consideration of the following description in conjunction with the figures, in which like reference numerals are carried forward.

Refer to FIG. 1. FIG. 1 illustrates a perspective view of an LED device according to an embodiment of the present invention. An LED device 100 includes a PCB 110, a reflector 120 and a lens 130.

The PCB 110 includes several solderable circuits 111, and every solderable circuit 111 extends from the top-side of the PCB 110 to the side of the PCB 110, and then connects to the bottom-side of the PCB 110.

The reflector 120 reflects the light from LED chip to the lens 130, and combines other parts for fixing. The lens 130 guides the light from the LED chip out of the LED device 100.

Figure 2:
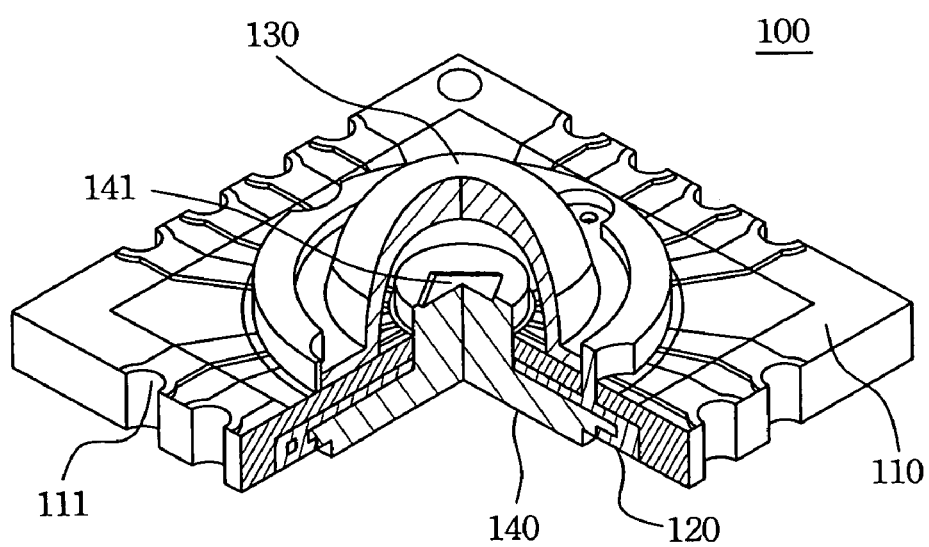
FIG. 2 illustrates a perspective and cross-sectional view of an LED device according to an embodiment of the present invention.

Refer to FIG. 2. FIG. 2 illustrates a perspective and cross-sectional view of an LED device according to an embodiment of the present invention. In FIG. 2, the LED device 100 includes a heat sink 140.

The top-side of the heat sink 140 has a chip-mounting area 141. The chip-mounting area 141 is a rectangular indentation for mounting an LED chip on the chip-mounting area 141 and electric connecting with the heat sink 140.

Several configurations can be observed from the cross-section of the PCB 110, Observable configurations include the reflector 120, the lens 130 and the heat sink 140. The reflector 120 passes through the reserve through holes of the PCB 110, then squeezes and fixes the PCB 110 from the top-side and the bottom-side respectively. The surrounding edge of the lens 130 is besieged and fixed by the circular part of the reflector 120. A part of the reflector 120 heated by the apparatus, which become deformed to squeeze and fix the lens 130. The reflector 120 also passes through the reserve through holes of the heat sink 140, and embedded with a hooking structure.

Figure 3:
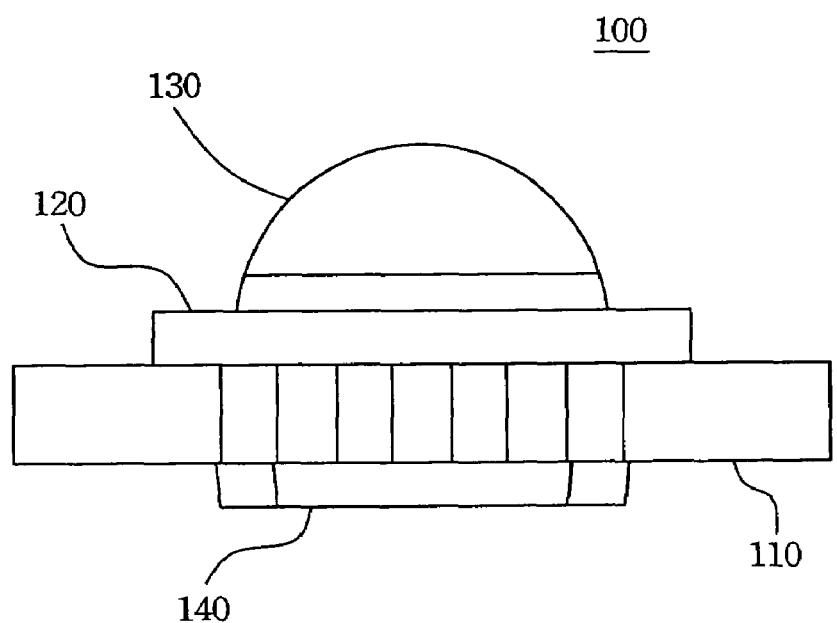
FIG. 3 illustrates a side view of an LED device according to an embodiment of the present invention.

Refer to FIG. 3. FIG. 3 illustrates a side view of an LED device according to an embodiment of the present invention. A part of the heat sink 140 is set in the PCB 110, and the other parts of the heat sink 140 are exposed to the exterior of the LED device 100. The part of the heat sink 140 set in the PCB 110 is combined closely to the reflector 120; and the other parts of the heat sink 140 exposed to the exterior of the LED device 100 increases the heat-dissipation capability.

Figure 4:
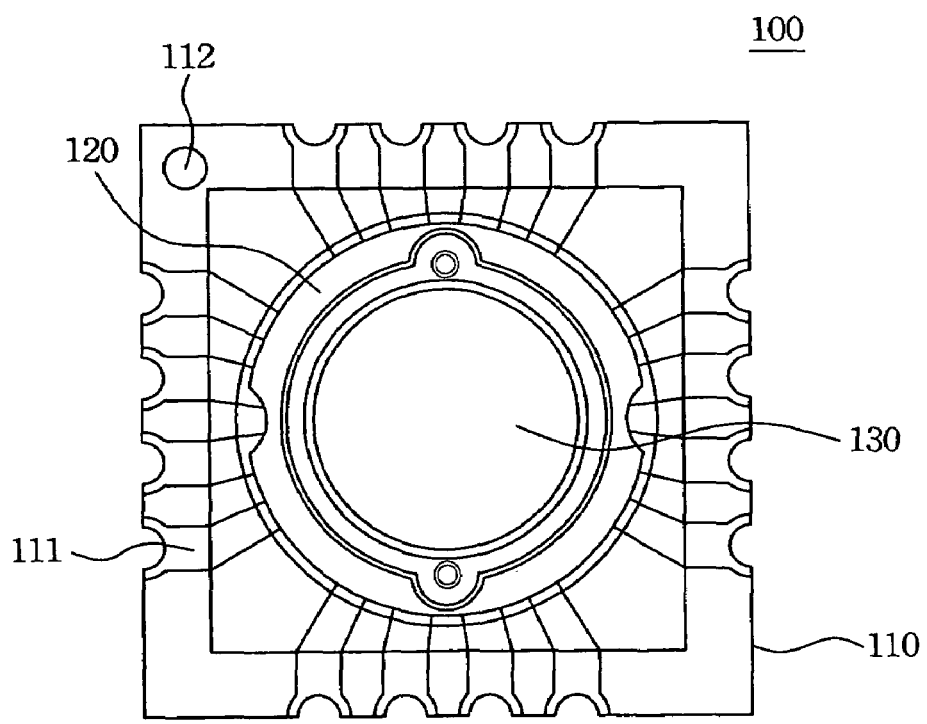
FIG. 4 illustrates a top view of an LED device according to an embodiment of the present invention.

Refer to FIG. 4. FIG. 4 illustrates a top view of an LED device according to an embodiment of the present invention. The lens 130 is surrounded by the circular part of the reflector 120. On the top-side of the PCB 110, there are several solderable circuits connected to the base distributed radially on the lens 130. There is an orientating hole 112 at a corner of the PCB 110 for orientating the LED device 100.

Figure 5:
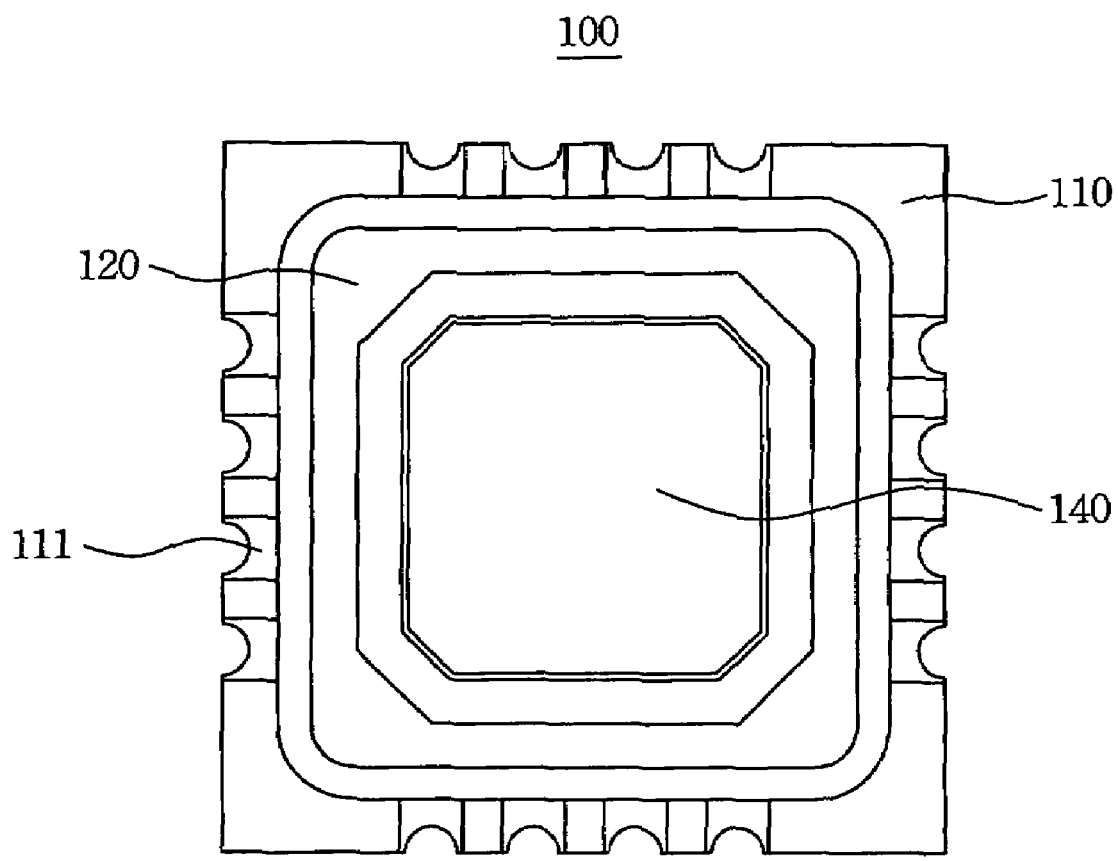
FIG. 5 illustrates a bottom view of an LED device according to an embodiment of the present invention.

Refer to FIG. 5. FIG. 5 illustrates a bottom view of an LED device according to an embodiment of the present invention. The solderable circuits 111 extend to the bottom-side of the PCB 110 for the convenience of circuit assembling. The heat sink 140 exposed to the outside of the LED device 100 means conducts heat from the inside of the LED device 100.

Figure 6B:
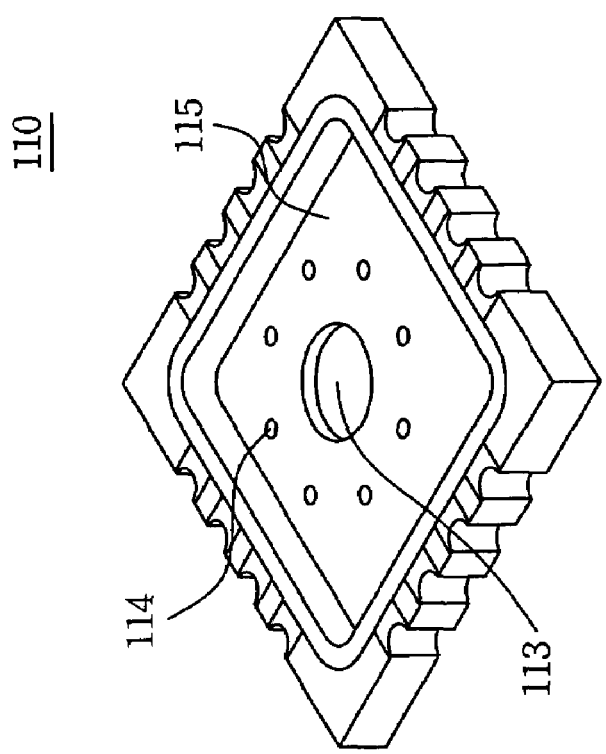
FIG. 6B illustrates a perspective and bottom view of a PCB according to an embodiment of the present invention.
Figure 6A:
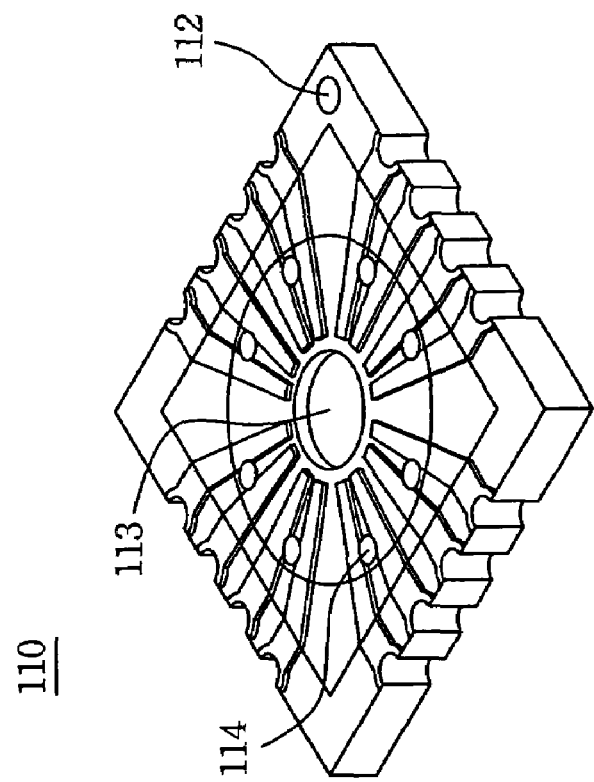
FIG. 6A illustrates a perspective and top view of a PCB according to an embodiment of the present invention.

Refer to FIG. 6A and FIG. 6B. FIG. 6A and FIG. 6B illustrates a top view and a bottom view of a PCB according to an embodiment of the present invention respectively. The PCB 110 includes several through holes 113, through holes 114 and an indentation 115.

The through hole 113 is where the heat sink 140 is set into the LED device 100. The through hole 114 enables communication between the top-side and the bottom-side of the PCB 110 for the fluid raw material of reflector flowing in the manufacturing process. When the environmental temperature is lowered below a certain degree, the fluid raw material of the reflector will form a solid reflector 120 to squeeze and fix the PCB 110.

The indentation 115 is located on the bottom-side of the PCB 110, and the indentation 115 is a dented space to contain the heat sink 140, which provides more contact area for the heat sink 140 and the PCB 110. Hence, the heat of the PCB 110 can be conducted to the outside of the LED device 100 more efficiently.

Figure 7A:
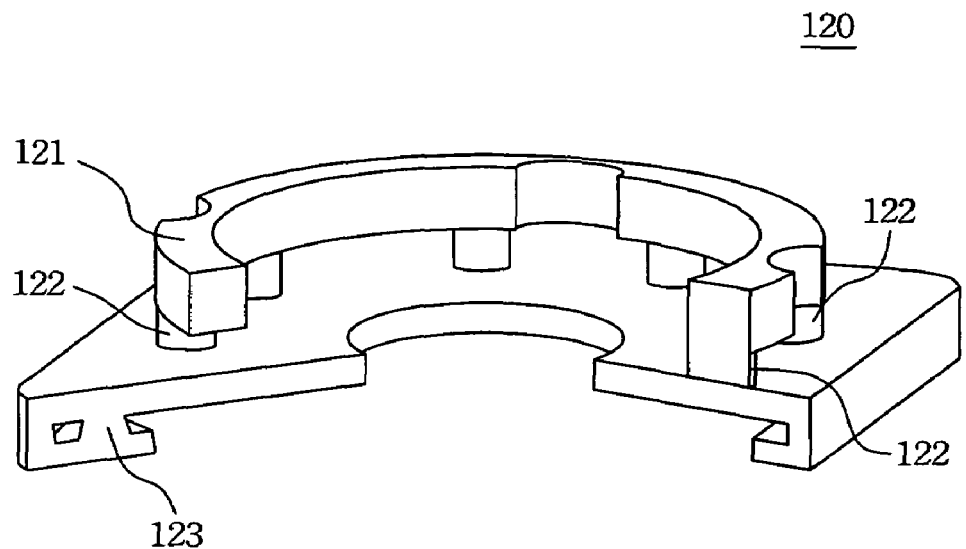
FIG. 7A illustrates a perspective and cross-sectional view of a reflector according to an embodiment of the present invention.

Refer to FIG. 7A. FIG. 7A illustrates a perspective and cross-sectional view of a reflector according to an embodiment of the present invention. The reflector 120 includes a circular part 121, several pillars 122 and several horn-like pillars 123.

The circular part 121 is located on the top-side of the PCB 110, and surrounds the lens 130. The several pillars 122 are inserted through several through holes 113 of the PCB 110, which connect with the circular part 121 and the part under the bottom-side of the PCB 110 of the reflector 120. The several horn-like pillars 123 are placed in the horn-like through holes of the heat sink 140, and cooperate with the "C" type structure under the bottom-side of the PCB 110 of the reflector 120 for tightly fixing the heat sink 140.

Figure 7B:
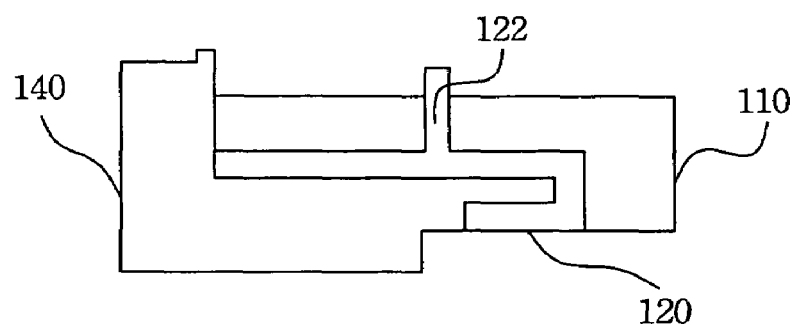
FIG. 7B illustrates a partial and cross-sectional view of an LED device according to an embodiment of the present invention.
Figure 7C:
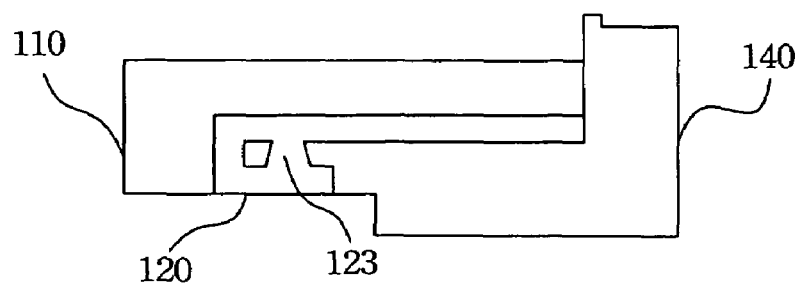
FIG. 7C illustrates a partial and cross-sectional view of an LED device according to an embodiment of the present invention.

Refer to FIG. 7B and FIG. 7C. FIG. 7B and FIG. 7C illustrate two partial and cross-sectional views of an LED device according to an embodiment of the present invention. FIG. 7B and FIG. 7C are illustrated by referring to FIG. 2. The pillar 122 of the reflector 120 put in the through hole of the PCB 110, the part higher than the PCB 110 of the reflector 120 is a part of the circular part 121. The horn-like pillars 123 of the reflector 120 cooperate with the horn-like through hole of the heat sink 140 to prevent the heat sink 140 from falling downwards.

Figure 8:
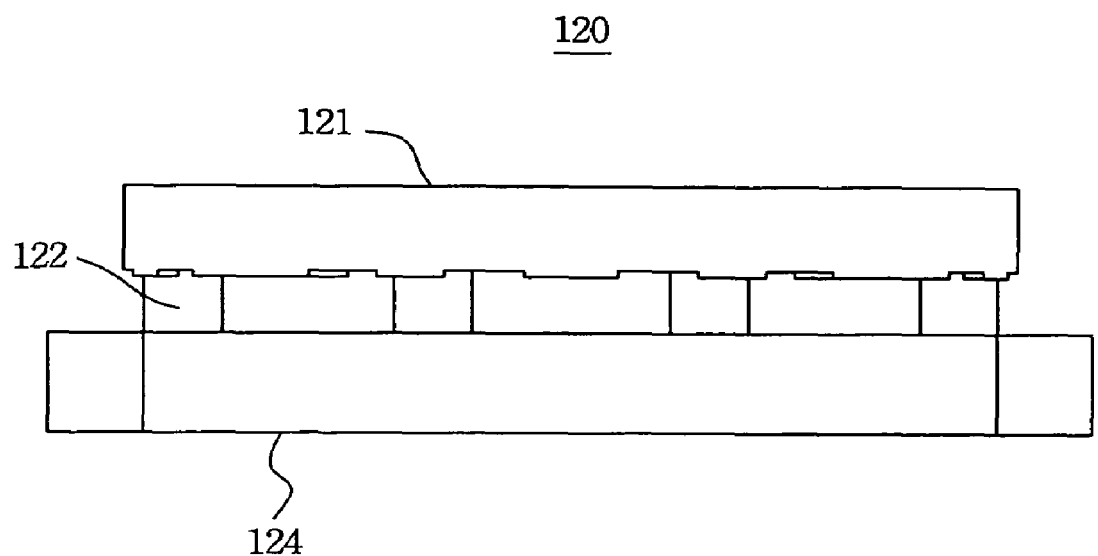
FIG. 8 illustrates a side view of a reflector according to an embodiment of the present invention.
Figure 9:
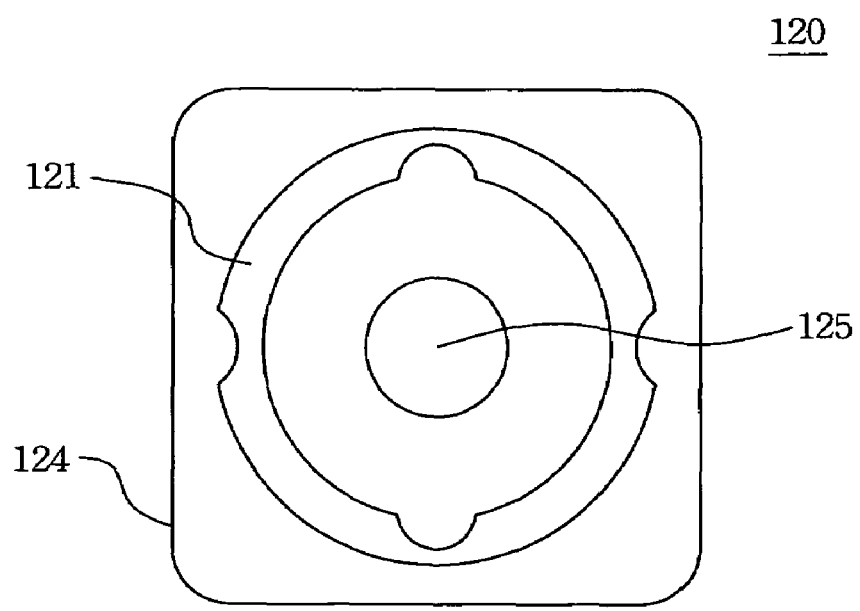
FIG. 9 illustrates a top view of a reflector according to an embodiment of the present invention.
Figure 10:
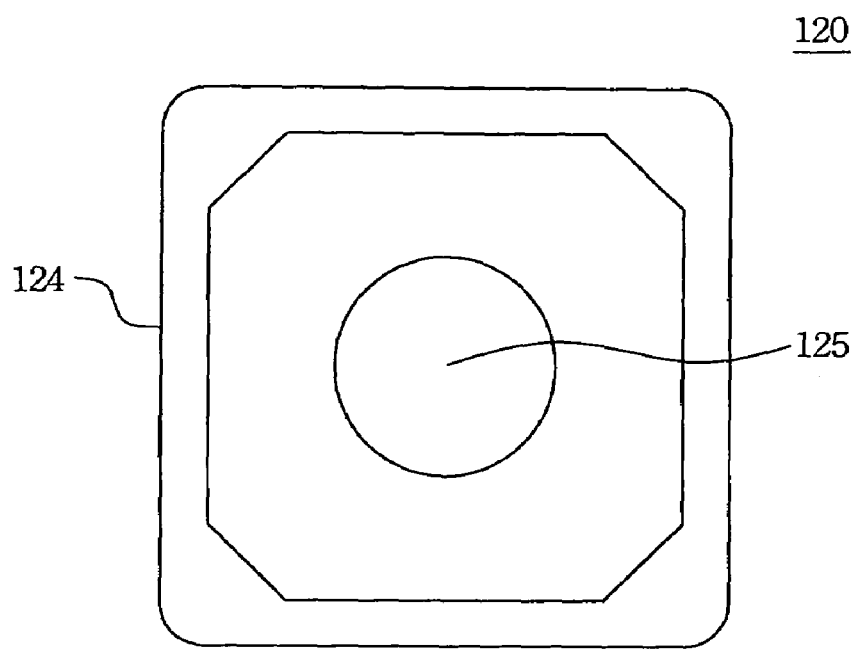
FIG. 10 illustrates a bottom view of a reflector according to an embodiment of the present invention.

Refer to FIG. 8, FIG. 9 and FIG. 10. FIG. 8, FIG. 9 and FIG. 10 illustrate a side view, a top view and a bottom view of a reflector according to an embodiment of the present invention respectively. The distances between every two pillars 122 is equidistant This arrangement provides a firm combination of one part above the PCB 110 of the reflector 120 and another part below the PCB 110 of the reflector 120. In FIG. 9, the center of a rectangular part 124 includes a through hole 125 located at the center of the circular part 121 for inserting the heat sink 140. The rectangular part 124 can cooperate with the indentation 115 in FIG. 6B exactly.

Figure 11:
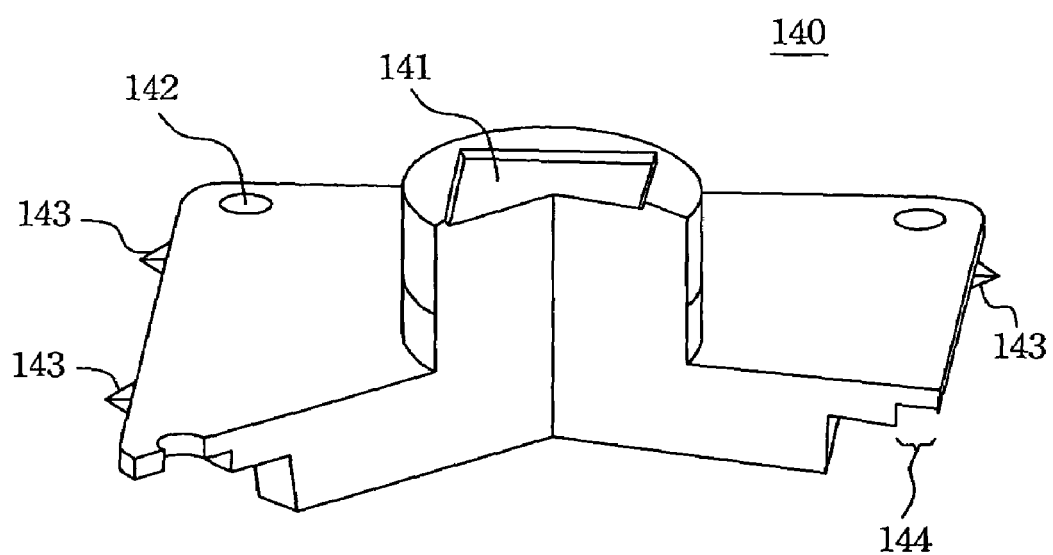
FIG. 11 illustrates a perspective and cross-sectional view of a heat sink according to an embodiment of the present invention.

FIG. 11 illustrates a perspective and cross-sectional view of a heat sink according to an embodiment of the present invention. The heat sink 140 includes a chip-mounting area 141, a horn-like through hole 142, a protrusion 143 and a hooking part 144.

The chip-mounting area 141 can be mounted on at least one LED chip, and be electrically connected to the heat sink 140 and the solderable circuit 111. The LED chip can only be electrically connected with the solderable circuit 111 in accordance with position of the solderable pad of the LED chip.

The horn-like through hole 142 and the protrusion 143 means the reflector 120 and the other parts can be connected more closely. The horn-like pillar 123 put in the horn-like through hole 142, and the protrusion 143 embed with the PCB 110 to form an embedded structure for preventing the heat sink 140 from falling off. The hooking part 144 cooperates with the rectangular part 124 to form a more steady combination.

Figure 12:
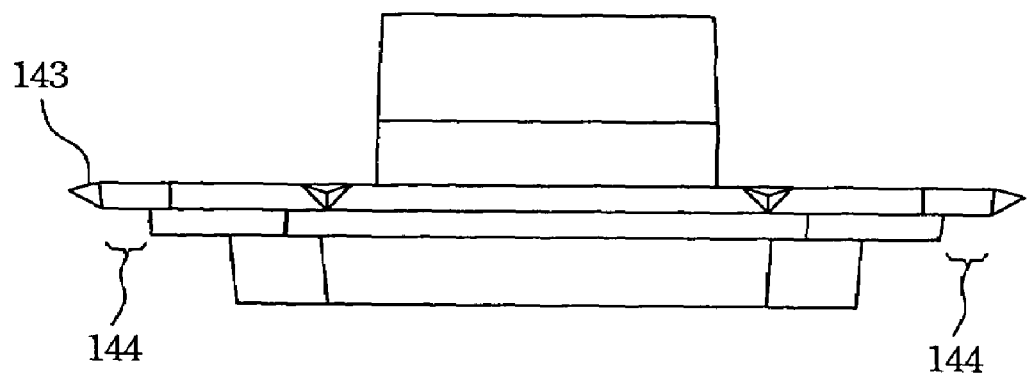
FIG. 12 illustrates a side view of a heat sink according to an embodiment of the present invention.
Figure 13:
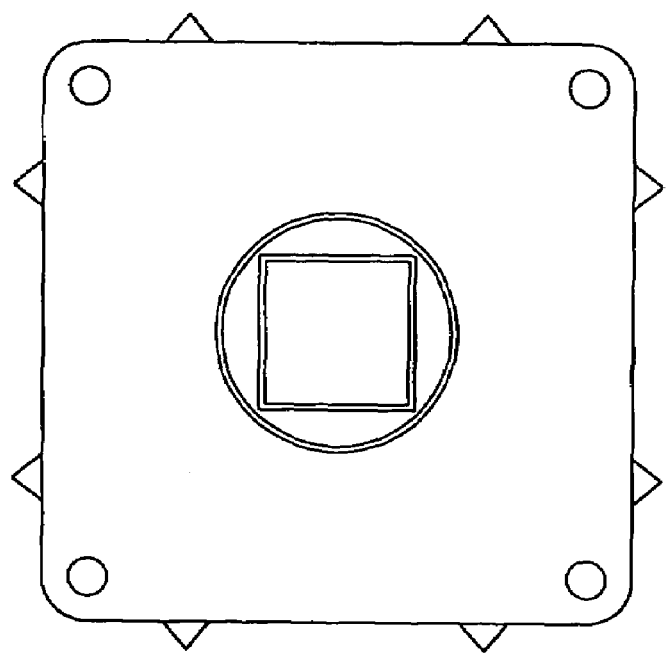
FIG. 13 illustrates a top view of a heat sink according to an embodiment of the present invention.
Figure 14:
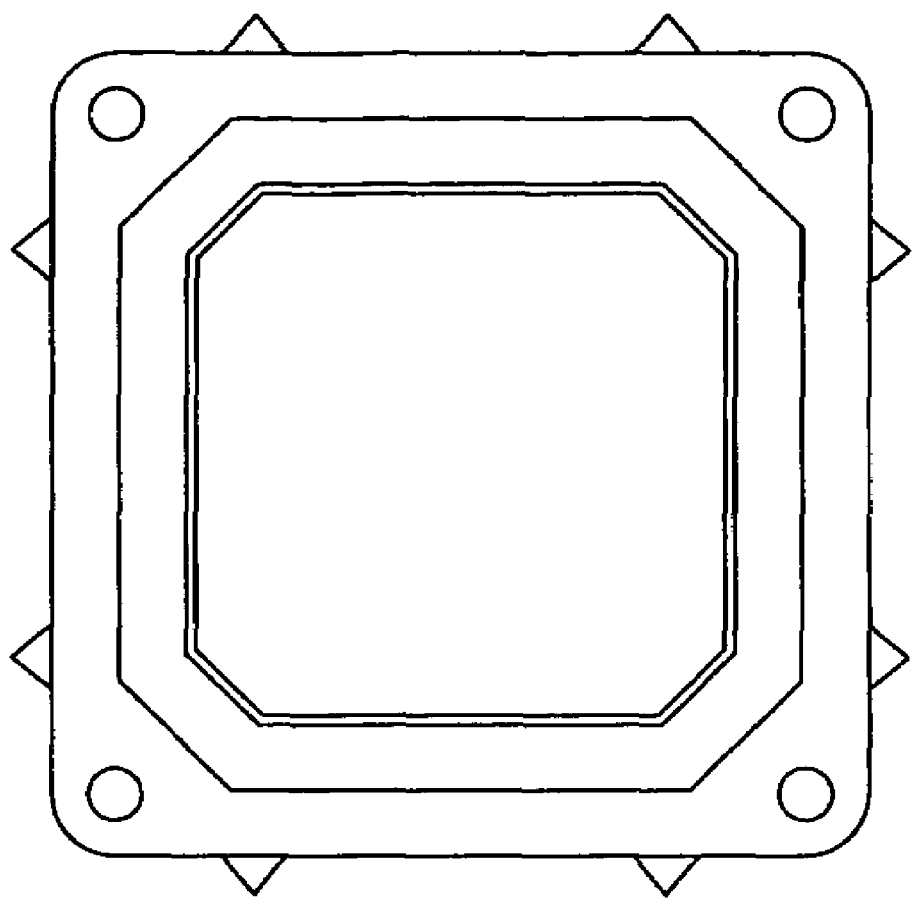
FIG. 14 illustrates a bottom view of a heat sink according to an embodiment of the present invention.

Refer to FIG. 12, FIG. 13 and FIG. 14. Refer to FIG. 12, FIG. 13 and FIG. 14 illustrate a side view, a top view and a bottom view of a heat sink according to an embodiment of the present invention respectively. The surrounding of the heat sink 140 has several protrusions 143, and the hooking part 144 also surrounds the bottom of the heat sink 140. The protrusion 143 and the hooking part 144 increase the level of combination of the heat sink 140, the PCB 110 and the reflector 120.

According to the composition and the embodiments above, there are many advantages of the present invention over the prior art, such as:

1. The reflector passes through the other parts of the LED device, which can make the durability of LED device structure better than conventional LED devices. Such as, this package structure can reduce the deformation and delamination caused by heat stress.

2. The solderable circuits of the PCB can apply to various directional light sources. Users can mount at least one LED chip for changing the outputting light color or intensity, and reduce amount of LED device mounting in the unit area.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode package, comprising:
   a printed circuit board, comprising two opposite surfaces, a relatively big through hole and a plurality of relatively small through holes disposed around the relatively big through hole, one of the two opposite surfaces including an indentation within which all the through holes are located;
   multiple pairs of solderable circuits, extending from one of the two opposite surfaces to the other one of the opposite surfaces through edges of the printed circuit board;
   a heat sink, comprising a first portion fitted within the relatively big through hole and a second portion fitted within the indentation, wherein the first portion comprises a chip-mounting area for mounting at least one LED chip;
   a lens, placed over the chip-mounting area; and
   a reflector having a first part immediately encircling the lens and a second part securing the second portion of the heat sink to the printed circuit board, wherein the first part and the second part interconnect with each other through the relatively small through holes.

2. The light emitting diode package of claim 1, wherein the printed circuit board is of a substantially rectangular shape.

3. The light emitting diode package of claim 2, wherein at least one pair of the multiple pairs of solderable circuits extends through each edge of the printed circuit board.

4. The light emitting diode package of claim 3, wherein the relatively big through hole is in a central area of the printed circuit board.

5. The light emitting diode package of claim 1, wherein the relatively big through hole is in a central area of the printed circuit board.

6. The light emitting diode package of claim 4, wherein each of the relatively small through holes is disposed between each pair of the solderable circuits.

7. The light emitting diode package of claim 1, wherein each of the relatively small through holes is disposed between each pair of the solderable circuits.

8. The light emitting diode package of claim 1, wherein the lens is substantially of a hemisphere shape.

9. The light emitting diode package of claim 1, wherein the first portion of the heat sink is of a circular cylinder shape.

10. The light emitting diode package of claim 9, wherein the second portion of the heat sink is of a substantially rectangular shape, which has protrusions to engage the indentation.

11. The light emitting diode package of claim 10, wherein the indentation is of a substantially rectangular shape.

12. The light emitting diode package of claim 1, wherein each pair of the solderable circuits extends from a margin of the indentation on one of the two opposite surfaces to a margin of the relatively big through hole on the other surface.

13. The light emitting diode package of claim 12, wherein the heat sink is electrically insulated from the solderable circuits.

14. The light emitting diode package of claim 1, wherein the indentation is of a substantially rectangular shape.

15. The light emitting diode package of claim 1, wherein the reflector comprises multiple pillars to interconnect the first part and the second part of the reflector through the relatively small through holes.

16. The light emitting diode package of claim 15, wherein intervals between every adjacent two pillars of the multiple pillars are equidistant.

17. The light emitting diode package of claim 1, wherein the second part of the reflector comprises a hook-shaped part to secure surrounding edges of the second portion of the heat sink.

18. The light emitting diode package of claim 17, wherein the second part of the reflector comprises a horn-like pillars to engage within a through hole on a corner of the second portion of the heat sink.

19. The light emitting diode package of claim 1, wherein the second part of the reflector comprises a horn-like pillar to engage within a through hole on a corner of the second portion of the heat sink.

20. The light emitting diode package of claim 1, wherein the second portion of the heat sink has a substantially flat, rectangular surface exposed by the second part of the reflector.

* * * * *